(12) United States Patent
Lee et al.

(10) Patent No.: US 8,383,461 B2
(45) Date of Patent: Feb. 26, 2013

(54) METHOD FOR MANUFACTURING SEMICONDUCTOR PACKAGE HAVING IMPROVED BUMP STRUCTURES

(75) Inventors: Ki Yong Lee, Seoul (KR); Seung Kweon Ha, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 1155 days.

(21) Appl. No.: 12/260,231

(22) Filed: Oct. 29, 2008

(65) Prior Publication Data

US 2009/0227073 A1 Sep. 10, 2009

(30) Foreign Application Priority Data

Mar. 7, 2008 (KR) .................. 10-2008-0021583

(51) Int. Cl.
*H01L 21/00* (2006.01)

(52) U.S. Cl. ............... 438/125; 438/106; 257/E21.503; 257/E21.512; 257/E23.008; 257/E23.011; 257/E23.062; 257/E23.067

(58) Field of Classification Search ............... 438/106, 438/125; 257/E21.503, 512, E23.008, 11, 257/62, 67
See application file for complete search history.

(56) References Cited

U.S. PATENT DOCUMENTS

| | | | | |
|---|---|---|---|---|
| 5,463,246 A * | 10/1995 | Matsunami | ................... | 257/621 |
| 5,528,080 A * | 6/1996 | Goldstein | ................... | 257/741 |
| 5,646,067 A * | 7/1997 | Gaul | ................... | 438/458 |
| 6,000,130 A * | 12/1999 | Chang et al. | ................... | 29/852 |
| 6,468,898 B1 * | 10/2002 | Usami | ................... | 438/638 |
| 6,593,224 B1 * | 7/2003 | Lin | ................... | 438/618 |
| 6,770,971 B2 * | 8/2004 | Kouno et al. | ................... | 257/734 |
| 6,781,224 B2 * | 8/2004 | Yoneda et al. | ................... | 257/686 |
| 6,862,189 B2 * | 3/2005 | Higuchi | ................... | 361/767 |
| 6,882,045 B2 * | 4/2005 | Massingill et al. | ................... | 257/724 |
| 6,905,951 B2 * | 6/2005 | Yoneda et al. | ................... | 438/611 |
| 6,951,809 B2 * | 10/2005 | Tarumi et al. | ................... | 438/627 |
| 7,071,569 B2 * | 7/2006 | Ho et al. | ................... | 257/778 |
| 7,390,732 B1 * | 6/2008 | Watanabe et al. | ................... | 438/612 |
| 7,435,680 B2 * | 10/2008 | Nakamura et al. | ................... | 438/678 |
| 7,745,736 B2 * | 6/2010 | Ogawa et al. | ................... | 174/262 |
| 7,763,809 B2 * | 7/2010 | Rokugawa et al. | ................... | 174/260 |
| 7,838,982 B2 * | 11/2010 | Nakamura | ................... | 257/700 |
| 8,035,033 B2 * | 10/2011 | Kobayashi | ................... | 174/250 |
| 8,062,911 B2 * | 11/2011 | Hasebe et al. | ................... | 438/17 |
| 8,097,946 B2 * | 1/2012 | Saitou et al. | ................... | 257/700 |
| 8,115,300 B2 * | 2/2012 | Muramatsu et al. | ................... | 257/700 |
| 2001/0035570 A1 * | 11/2001 | Iijima et al. | ................... | 257/678 |
| 2002/0060904 A1 * | 5/2002 | Higuchi | ................... | 361/760 |
| 2003/0160325 A1 * | 8/2003 | Yoneda et al. | ................... | 257/758 |
| 2004/0018722 A1 * | 1/2004 | Tarumi et al. | ................... | 438/638 |

(Continued)

FOREIGN PATENT DOCUMENTS

| | | |
|---|---|---|
| KR | 10-0574986 A | 4/2006 |
| KR | 10-0847033 B1 | 7/2008 |

*Primary Examiner* — Thao Le
*Assistant Examiner* — Eric Jones
(74) *Attorney, Agent, or Firm* — Ladas & Parry LLP (57) ABSTRACT

A method for manufacturing a semiconductor package includes the steps of forming first circuit patterns on an upper surface of a carrier substrate. Bumps are formed in recesses defined on the upper surface of the carrier substrate. An insulation layer is formed on the upper surface of the carrier substrate to cover the first circuit patterns. Second circuit patterns are formed on an upper surface of the insulation layer so as to be electrically connected with the first circuit patterns. The carrier substrate is then separated from the insulation layer.

17 Claims, 8 Drawing Sheets

U.S. PATENT DOCUMENTS

| | | | |
|---|---|---|---|
| 2004/0224499 A1* | 11/2004 | Yoneda et al. | 438/640 |
| 2005/0230848 A1* | 10/2005 | Nakatani et al. | 257/783 |
| 2006/0043593 A1* | 3/2006 | Mori et al. | 257/758 |
| 2006/0094162 A1* | 5/2006 | Yabushita et al. | 438/118 |
| 2006/0131730 A1* | 6/2006 | Nakamura | 257/700 |
| 2007/0128868 A1* | 6/2007 | Halahan et al. | 438/687 |
| 2008/0185176 A1* | 8/2008 | Hagihara | 174/262 |

* cited by examiner

METHOD FOR MANUFACTURING SEMICONDUCTOR PACKAGE HAVING IMPROVED BUMP STRUCTURES

CROSS-REFERENCE TO RELATED APPLICATIONS

The present application claims priority to Korean patent application number 10-2008-0021583 filed on Mar. 7, 2008, which is incorporated herein by reference in its entirety.

BACKGROUND OF THE INVENTION

The present invention relates generally to a method for manufacturing a semiconductor package, and more particularly to a method for manufacturing a semiconductor package having an improved bump structure.

Recent semiconductor design trends relate to semiconductor chips capable of storing and processing vast amounts of data quickly and semiconductor packages having the semiconductor chips mounted to circuit boards.

Chip scale packages having a size no greater than 100% to 105% of the size of a semiconductor chip have been disclosed in the art.

A flip chip package is one type of chip scale package. The flip chip package includes bump structures formed on a substrate, which are connected to the bonding pads of a semiconductor chip. The flip chip package can significantly reduce the size of the semiconductor package.

However, as the size of semiconductor chips continues to decrease, the size of bonding pads and/or the gap between adjacent bonding pads decreases as well. Such decreases in the size of bump structures on the substrate and the gap between the bump structures lead to difficulties in forming the bump structures.

Bump structures having the shape of protrusions may be formed by etching a metal layer through a wet etching process.

However, forming the bump structures having the shape of protrusions by etching a metal layer has several disadvantages. First, forming the bump structures having the shape of protrusions by etching a metal layer is a slow and time consuming process. Second, forming the bump structures having the shape of protrusions by etching a metal layer results in the bump structures having non-uniform sizes. When the bump structures have non-uniform sizes, the electrical connections between the semiconductor chip and the bump structures are of poor quality.

Also, when the bump structures having the shape of protrusions are formed by isotropically etching a metal layer, the area of the upper portions of the bump structures is likely to become smaller than the area of the lower portions of the bump structures, and therefore the connection area between the bump structures and the bonding pads is decreased.

Further, when forming the bump structures having the shape of protrusions by etching a metal layer, as the height of the bump structures increases, the thickness of the metal layer increases. As the height and thickness of the bump structures increases, forming the bump structures becomes increasingly more difficult and defects are likely to occur in the bump structures.

SUMMARY OF THE INVENTION

Embodiments of the present invention are include a method for manufacturing a semiconductor package which significantly shortens a time required for forming bump structures and improves the size uniformity of the bump structures.

In one embodiment of the present invention, a method for manufacturing a semiconductor package comprises the steps of forming first circuit patterns on an upper surface of a carrier substrate to have bumps filled in recesses which are defined on the upper surface of the carrier substrate; forming an insulation layer on the upper surface of the carrier substrate to cover the first circuit patterns; forming second circuit patterns on an upper surface of the insulation layer to be electrically connected with the first circuit patterns; and separating the carrier substrate from the insulation layer.

The step of forming the first circuit patterns on the upper surface of the carrier substrate comprises the steps of attaching a conductive layer on the upper surface of the carrier substrate; defining recesses on the upper surface of the carrier substrate by patterning the conductive layer and the carrier substrate; forming a metal seed layer on the conductive layer and on surface portions of the carrier substrate which define the recesses; forming a plating layer using the metal seed layer to have the bumps filled in the recesses; and patterning the plating layer, the metal seed layer and the conductive layer.

In the step of defining the recesses, the surface portions of the carrier substrate, which define the recesses, have the sectional shape of any one of a cone and a circular column.

In the step of forming the metal seed layer, the metal seed layer is formed through an electroless plating process or an electroplating process.

In the step of defining the recesses, the recesses are defined using laser beam or through a laser drilling process or a drilling process.

In the step of forming the bumps, the bumps are formed through a plating process.

The step of forming the second circuit patterns comprises the steps of placing a conductive layer on the insulation layer; patterning the conductive layer and the insulation layer and thereby defining via holes to expose the first circuit patterns; forming conductive vias for connecting the conductive layer and the first circuit patterns; and patterning the conductive layer placed on the insulation layer.

After the step of separating the carrier substrate from the insulation layer, the method further comprises the step of adjusting a height of the bumps.

In the step of adjusting the height of the bumps, the sectional shape of the bumps is changed to a truncated cone or a circular column.

The step of forming the first circuit patterns on the upper surface of the carrier substrate comprises the steps of defining recesses by patterning the carrier substrate; forming a conductive layer on the upper surface of the carrier substrate and on surface portions of the carrier substrate which define the recesses; forming the bumps in the recesses using the conductive layer; and patterning the conductive layer.

In the step of forming the conductive layer, the conductive layer is formed through an electroless plating process or an electroplating process.

In the step of forming the conductive layer, the conductive layer is formed to have a first thickness on the upper surface of the carrier substrate and a second thickness less than the first thickness on the surface portions of the carrier substrate which define the recesses.

In the step of forming the first circuit patterns, the bumps are formed at a center portion of the carrier substrate.

In the step of forming the first circuit patterns, the bumps are formed along edges of the carrier substrate.

After the step of forming the second circuit patterns, the method further comprises the steps of forming first solder resist patterns on the insulation layer to have first openings which expose portions of the second circuit patterns; and forming second solder resist patterns on the insulation layer to have second openings which expose the bumps.

After the step of forming the first solder resist patterns, the method further comprises the step of forming at least one of a nickel layer and a gold layer on the second circuit patterns which are exposed through the first openings.

After the steps of forming the first and second solder resist patterns, the method further comprises the step of electrically connecting bonding pads of a semiconductor chip which are formed to face the respective bumps, to the bumps.

The method further comprises the step of filling an underfill material between the semiconductor chip and the second solder resist patterns.

After the step of forming the first and second solder resist patterns, the method further comprises the steps of placing an adhesive member on the second solder resist patterns; attaching the semiconductor chip having the bonding pads which face the second solder resist patterns, on the adhesive member; and bonding the bonding pads and the first circuit patterns using conductive wires.

The bumps are formed to have a height greater than a thickness of the semiconductor chip.

DESCRIPTION OF SPECIFIC EMBODIMENTS

Figure 1:
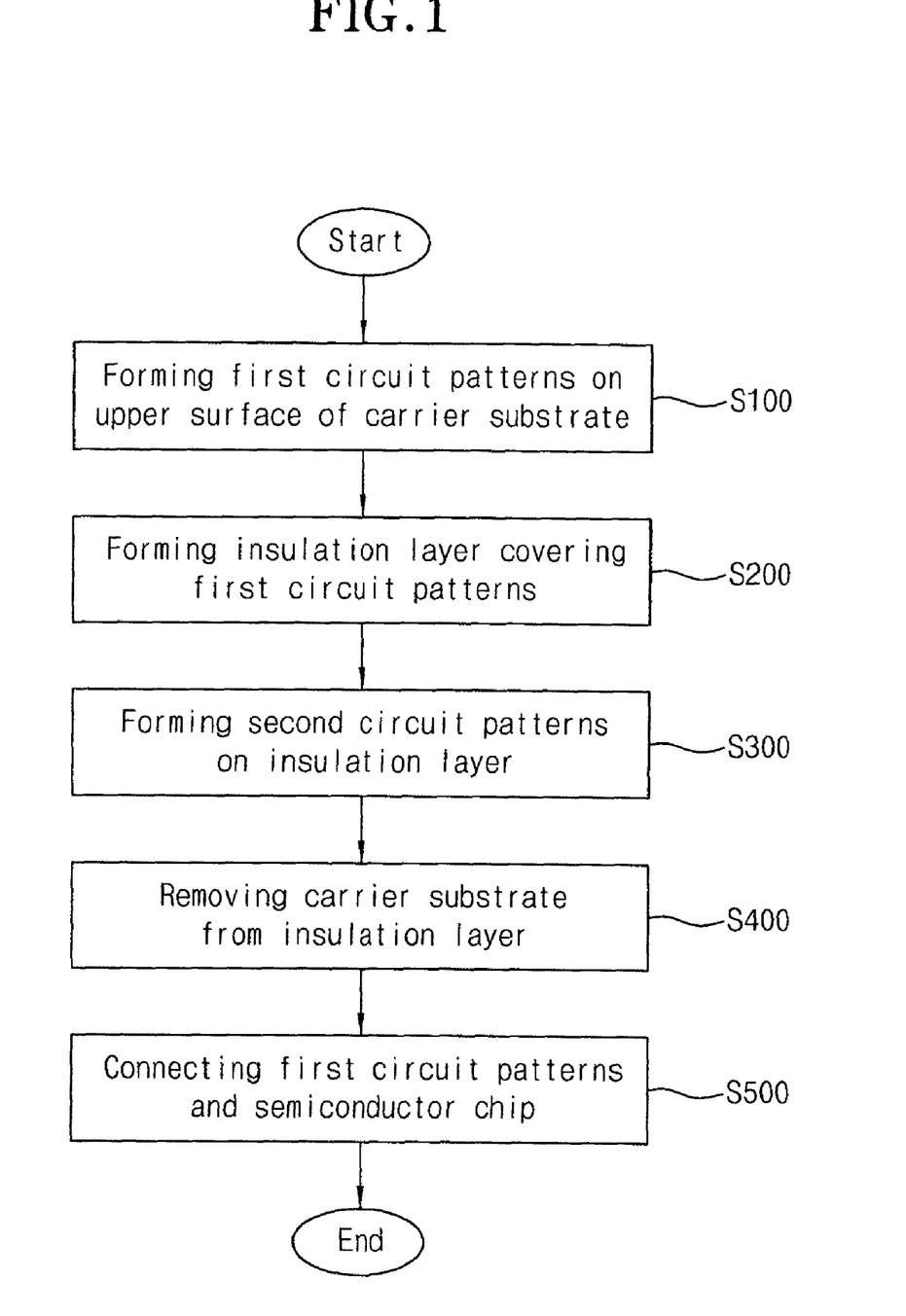
FIG. 1 is a flow chart showing a method for manufacturing a semiconductor package in accordance with an embodiment of the present invention.

FIG. 1 is a flow chart showing a method for manufacturing a semiconductor package in accordance with an embodiment of the present invention. FIGS. 2 through 8 are cross-sectional views showing processes for forming first and second circuit patterns on a carrier substrate.

Referring to FIG. 1, the manufacture a semiconductor package includes, first, the step of forming first circuit patterns on an upper surface of a carrier substrate. The first circuit patterns are formed on the upper surface of the carrier substrate such that the first circuit patterns have bumps located in the recesses defined on the upper surface of the carrier substrate (S100).

Figure 2:
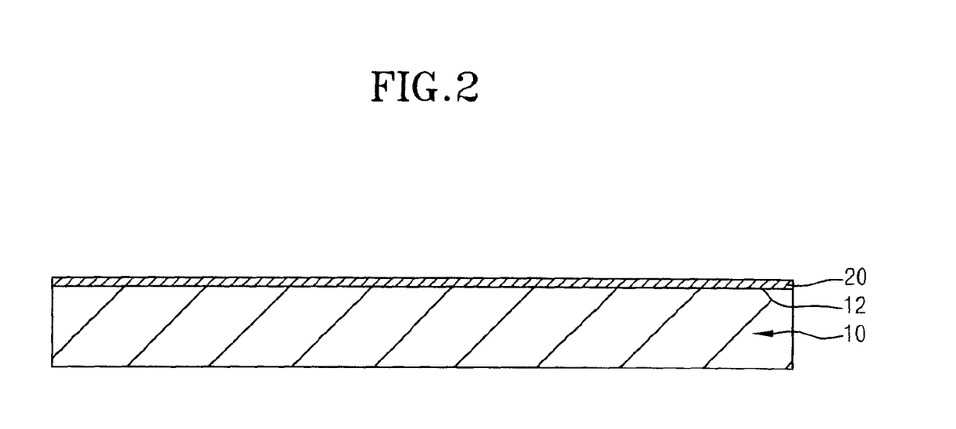
FIGS. 2 through 8 are cross-sectional views showing processes for forming first and second circuit patterns on a carrier substrate.

As shown in FIG. 2, to form the first circuit patterns, a conductive layer 20 is formed on an upper surface 12 of a carrier substrate 10. The carrier substrate 10 has the shape of a plate and may contain various materials for allowing the carrier substrate 10 to be easily detached from the conductive layer 20.

For example, the conductive layer 20 can contain a metallic material having excellent electrical characteristics (e.g. electrical conductivity) such as copper. The conductive layer 20 may be attached to the upper surface 12 of the carrier substrate 10 using an adhesive. Alternatively, the conductive layer 20 may be formed on the carrier substrate 10 through a physical vapor deposition (PVD) process.

Figure 3:
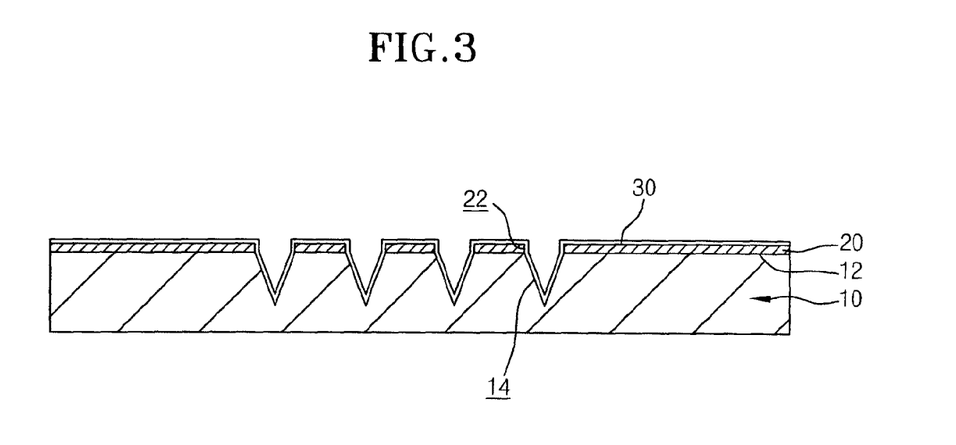

Referring to FIG. 3, after the conductive layer 20 is formed on the upper surface 12 of the carrier substrate 10, the conductive layer 20 and the carrier substrate 10 are patterned. As a result of the patterning, through-holes 22 are defined in the conductive layer 20 and recesses 14 are defined on the upper surface 12 of the carrier substrate 10 in correspondence with the through-holes 22.

In the present embodiment, for example, a plurality of recesses 14 may be located on a central portion of the carrier substrate 10 in the form of a matrix (i.e. an M×N array). Alternatively, a plurality of recesses 14 may be located along the edges of the carrier substrate 10 in the form of a matrix.

The through-holes 22 of the conductive layer 20 and the recesses 14 of the carrier substrate 10 may be defined using laser beam, through a laser drilling process, or a drilling process. The recesses 14 of the carrier substrate 10 are defined to have a depth less than the thickness of the carrier substrate 10. That is, the recesses 14 are defined in the carrier substrate 10 in such a way as to not extend through the carrier substrate 10.

In the present embodiment, the recesses 14 defined in the carrier substrate 10 may have the shape of, for example, a cone or a circular column. Alternatively, the recesses 14 defined in the carrier substrate 10 may have shapes other than the cone and the circular column.

A metal seed layer 30 is formed on the conductive layer 20 and the surface portions of the carrier substrate 10 which define the recesses 14 through an electroless plating process or an electroplating process after the through-holes 22 are defined in the conductive layer 20 and the recesses 14 are defined in the carrier substrate 10.

In the present embodiment, the metal seed layer 30 is formed on the surface portions of the carrier substrate 10 which define the recesses 14 through the electroless plating process or the electroplating process, and the thickness of the conductive layer 20 is precisely adjusted.

Figure 4:
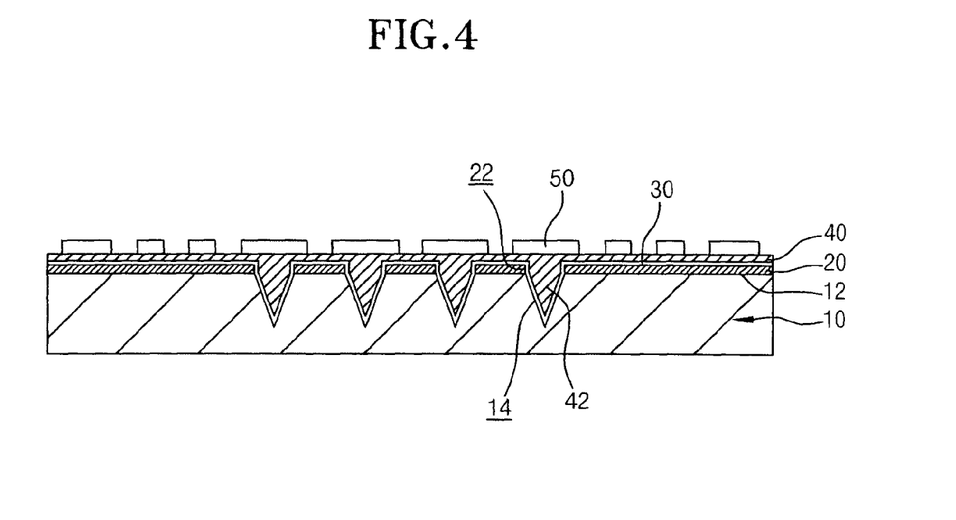

Referring to FIG. 4, a plating layer 40 is formed on the metal seed layer 30 through a plating process after the metal seed layer 30 is formed on the conductive layer 20 and the surface portions of the carrier substrate 10 which define the recesses 14. The plating layer 40 is formed to have bumps 42 which are filled in the respective recesses 14. Alternatively, the recesses 14 may be formed in the carrier substrate 10 before the conductive layer 28 is formed. The conductive layer 28 may then be formed on the upper surface 12 of the carrier substrate 10 and within the recesses 14 such that the bumps 45 consist of the portions of the conductive layer 28 formed within the recesses 14.

In the present embodiment, it is advantageous to form the bumps 42 in the recesses 14 through the plating process after the recesses 14 are defined in the carrier substrate 10 as described above. When compared to bumps formed by patterning a metal layer through a wet etching process, the bumps 42 formed according to the present invention are formed with a reduced manufacturing time and have a uniform shape.

A photoresist film (not shown) is formed on the plating layer 40 after the plating layer 40 having the bumps 42 is formed on the carrier substrate 10. The photoresist film is patterned through a lithographic process and a development process, so as to form photoresist patterns 50 on the plating layer 40.

Figure 5:
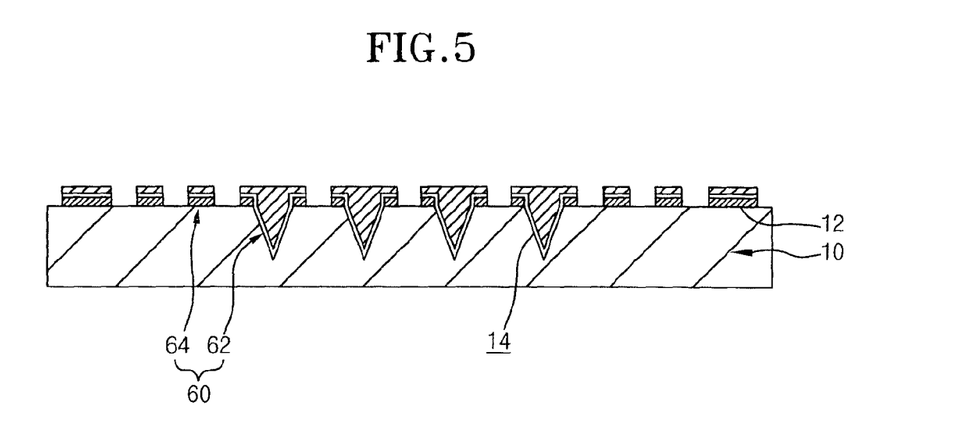

Referring to FIG. 5, the plating layer 40, the metal seed layer 30 and the conductive layer 20 are patterned using the photoresist patterns 50 as etch masks so as to define first circuit patterns 60 on the carrier substrate 10. The first circuit patterns 60 include bump structures 62 and first wiring lines 64 connected with the bump structures 62.

Figure 6:
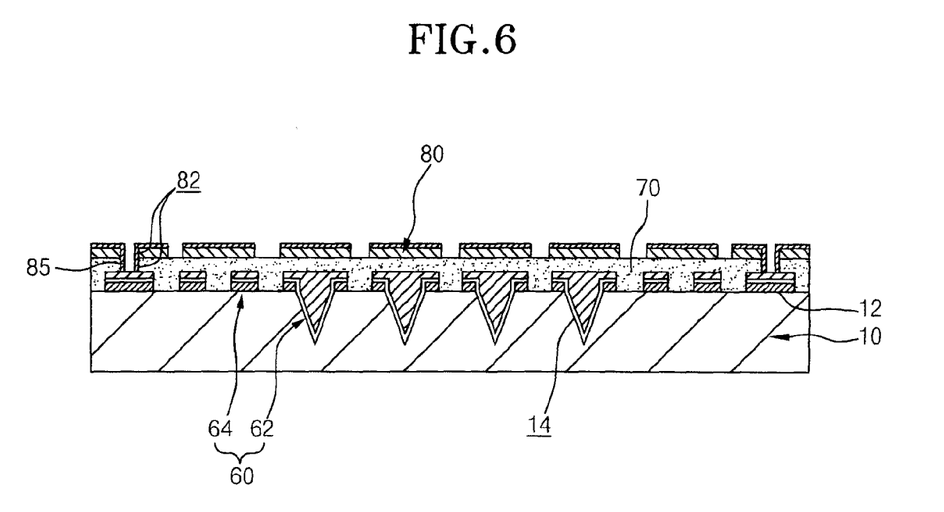

Referring to FIGS. 1 and 6, after the first circuit patterns 60 are formed, the step of forming an insulation layer 70 on the upper surface 12 of the carrier substrate 10 to cover the first circuit patterns 60 is implemented (S200).

In the present embodiment, the insulation layer 70 may include, an organic layer containing organic material, or alternatively the insulation layer may include an inorganic layer containing inorganic material.

After the insulation layer 70 is formed, the step of forming second circuit patterns is implemented (S300).

To form the second circuit patterns, a conductive layer (not shown) is formed on the insulation layer 70 shown in FIG. 6. In the present embodiment, the conductive layer may be attached to the insulation layer 70 by an adhesive or the like. Alternatively, the conductive layer may be formed on the insulation layer 70 through a physical vapor deposition process.

After the conductive layer is formed on the insulation layer 70, via holes 82 are defined through the conductive layer and the insulation layer 70. The via holes 82 may be defined using a laser beam, through a laser drilling process, or through a drilling process. The via holes 82 are defined so as to expose portions of the first circuit patterns 60.

After the via holes 82 are defined, conductive vias 85 are formed through an electroless plating process or an electroplating process. The conductive vias 85 electrically connect the conductive layer formed on the insulation layer 70 with the first circuit patterns 60 through the via holes 82. While forming the conductive vias 85, a plating process is conducted for the conductive layer formed on the insulation layer 70. The plating process increases the thickness of the conductive layer formed on the insulation layer 70.

After the conductive vias 85 are formed, photoresist patterns (not shown) are formed on the conductive layer. The conductive layer is then patterned using the photoresist patterns as etch masks to form second circuit patterns 80 the insulation layer 70.

Figure 7:
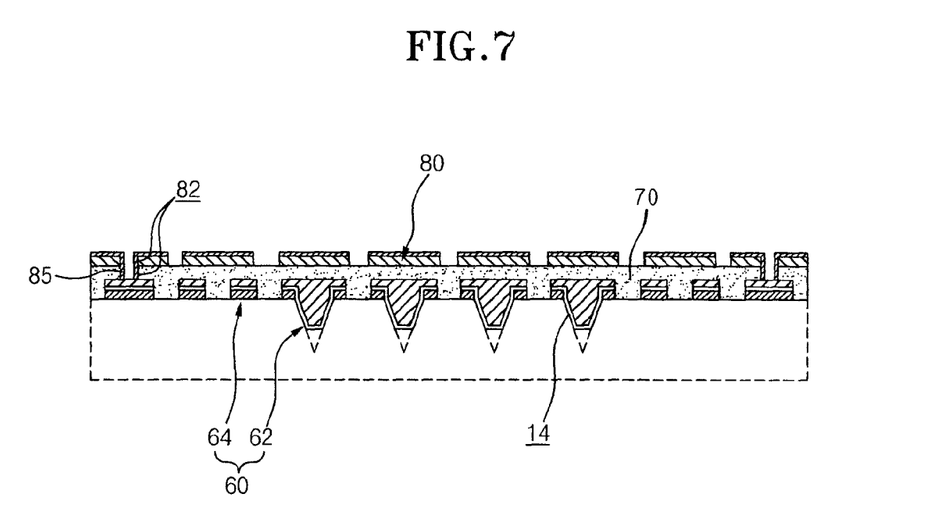

Referring to FIGS. 1 and 7, after the second circuit patterns 80 are formed on the insulation layer 70, the step of removing the carrier substrate 10 from the insulation layer 70 is implemented (S400).

After the carrier substrate 10 is removed from the insulation layer 70, the height of the bump structures 62, which project from the insulation layer 70, is mechanically adjusted. When adjusting the height of the bump structures 62, the of the bump structures 62 is changed, for example, from a cone to a truncated cone.

In the present embodiment, the height of the bump structures 62 can be freely adjusted by mechanically adjusting the height of the bump structures 62 after the bump structures 62 are formed through the plating process.

Figure 8:
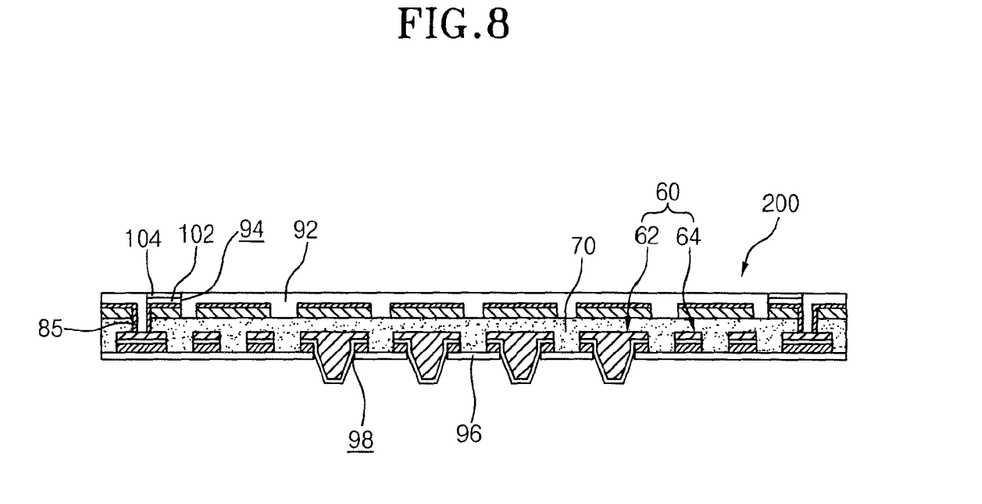

Referring to FIG. 8, first solder resist patterns 92 are formed on the upper surface of the insulation layer 70, which has the second circuit patterns 80 formed thereon, after the height of the bump structures 62 is adjusted.

To form the first solder resist patterns 92 on the upper surface of the insulation layer 70, a solder resist film (not shown) is formed on the upper surface of the insulation layer 70, and then the solder resist film is patterned through a photo process including a lithographic process and a development process. The first solder resist patterns 92 include first openings 94 that expose portions of the respective second circuit patterns 80.

Second solder resist patterns 96 are formed on the lower surface of the insulation layer 70, which includes the first circuit patterns 60 formed therein. To form the second solder resist patterns 96 on the lower surface of the insulation layer 70, a solder resist film (not shown) is formed on the lower surface of the insulation layer 70, and then the solder resist film is patterned through a photo process including a lithographic process and a development process. The second solder resist patterns 96 include second openings 98, which expose the bump structures 62.

After the first solder resist patterns 92 are formed, at least one of a nickel layer 102 and a gold layer 104 are formed on the second circuit patterns 80 within the first openings 94.

Figure 9:
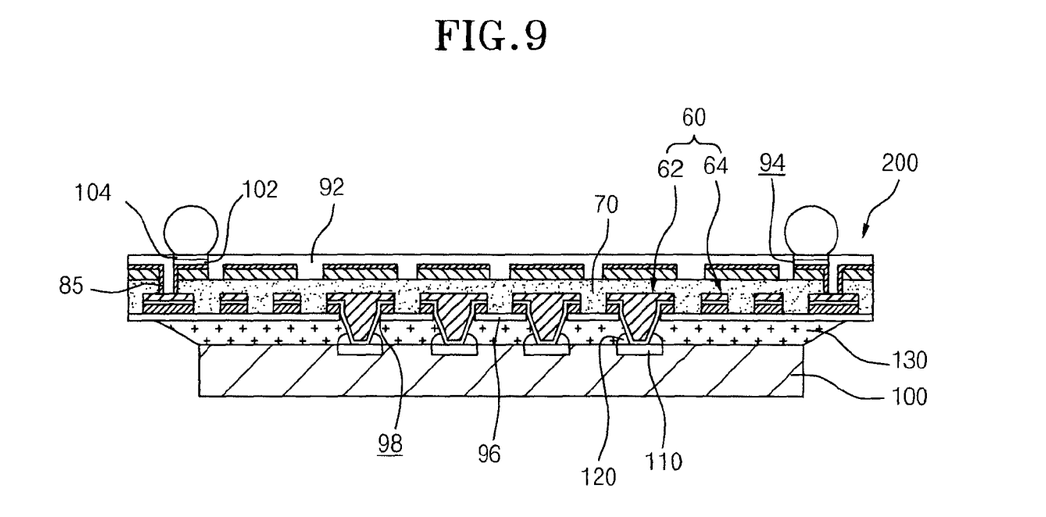
FIG. 9 is a cross-sectional view showing a semiconductor chip connected with the first circuit patterns in a flip chip style.

FIG. 9 is a cross-sectional view showing a semiconductor chip which is connected with the first circuit patterns in a flip chip style.

Referring to FIGS. 1 and 9, after removing the carrier substrate 10 from the insulation layer 70, bonding pads 110 of a semiconductor chip 100 are electrically coupled to the bump structures 62 (S500).

In the present embodiment, the plurality of bump structures 62 may be located on the central portion of the insulation layer 70 in the form of a matrix, and the bonding pads 110 of the semiconductor chip 100 are formed at positions that correspond to the respective bump structures 62.

In the present embodiment, the bonding pads 110 of the semiconductor chip 100 and the bump structures 62 can be directly electrically coupled with each other. Alternatively, the bonding pads 110 may be electrically coupled to the bump structures 62 using connection members 120 such as solders.

When the bump structures 62 are electrically connected to the bonding pads 110 of the semiconductor chip 100. A gap may be formed depending on the height of the bump structures 62. In the present invention the gap between the second solder resist patterns 96 and the semiconductor chip 100 may be eliminated by adjusting the height of the bump structures 62. Alternatively, when a gap is present between the second solder resist patterns 96 and the semiconductor chip 100, an under-fill member 130 containing an under-fill material may be interposed between the second solder resist patterns 96 and the semiconductor chip 100 so as to fill the gap.

Figure 10:
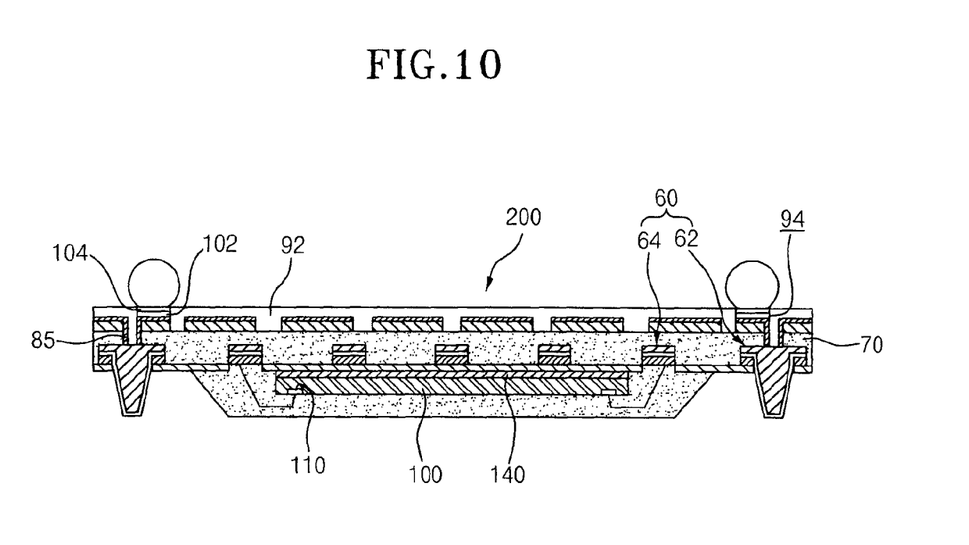
FIG. 10 is a cross-sectional view showing a semiconductor chip connected with the first circuit patterns using conductive wires.

FIG. 10 is a cross-sectional view showing a semiconductor chip connected with the first circuit patterns using conductive wires.

Referring to FIGS. 1 and 10, after removing the carrier substrate 10 from the insulation layer 70, bonding pads 110 of a semiconductor chip 100 are electrically coupled with the bump structures 62.

In the present embodiment, the bump structures 62 may be formed, for example, along the edges of the insulation layer 70. An adhesive member 140 is placed at the central portion of the insulation layer 70 so as to connect the insulation layer 70 to the semiconductor chip 100. In the present embodiment, the semiconductor chip 100 includes bonding pads 110 which face the insulation layer 70.

After the semiconductor chip 100 is placed on the adhesive member 140, the bonding pads 110 are electrically coupled to the first circuit patterns 60 using conductive wires 150, whereby the semiconductor package 200 is completed.

In the present embodiment, the height of the bump structures 62 may be defined to be greater than the thickness of the semiconductor chip 100 including the height of the loops of the conductive wires 150, which connect the bonding pads 110 of the semiconductor chip 100 to the first circuit patterns 60. Additionally, a plurality of semiconductor packages 200 formed according to the present embodiment may be stacked to constitute a stacked semiconductor package.

FIGS. 11 through 14 are cross-sectional views showing a method for manufacturing a semiconductor package in accordance with another embodiment of the present invention. The method for manufacturing a semiconductor package in accordance with another embodiment of the present invention is the same as that of the first embodiment of the present invention described with reference to FIGS. 1 through 10, with the exception of the process for forming first circuit patterns. Therefore, descriptions of like processes will be omitted, and the same reference numerals will be used to refer to the same or like component parts.

Figure 11:
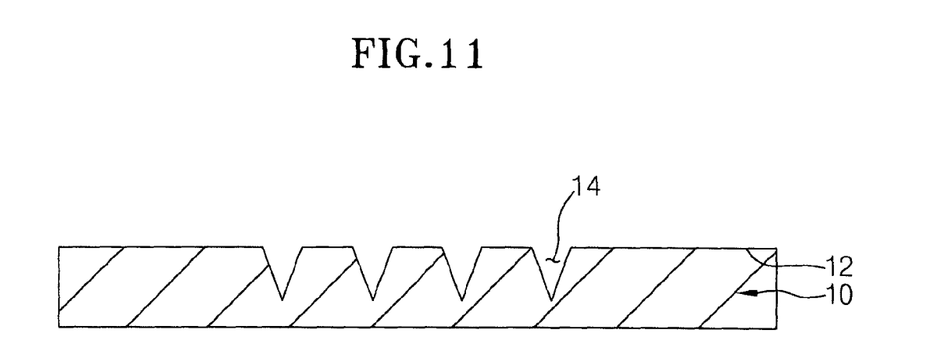
FIGS. 11 through 14 are cross-sectional views showing a method for manufacturing a semiconductor package in accordance with another embodiment of the present invention.

Referring to FIG. 11, a carrier substrate 10 is prepared in order to manufacture a semiconductor package. According to present embodiment, the carrier substrate 10 may be formed in the shape of a plate and may comprise various materials for allowing the carrier substrate 10 to be easily detached from a conductive layer.

After the carrier substrate 10 is prepared, recesses 14 are defined on an upper surface 12 of the carrier substrate 10. The recesses 14 defined on the upper surface 12 of the carrier substrate 10 may be defined, for example, using laser beam, through a laser drilling process, or through a drilling process. The recesses 14 of the carrier substrate 10 are defined on the upper surface 12 at positions corresponding to the locations of bump structures which will be subsequently formed as described below.

According to the present embodiment, the recesses 14 defined on the upper surface 12 of the carrier substrate 10 may have the shape of a cone or a circular column. However, the present invention is not limited in this way, and the groves formed on the upper surface 12 of the carrier substrate 10 may be formed in any number of shapes.

In the present embodiment, the recesses 14 may be located at a central portion of the upper surface 12 of the carrier substrate 10 in the form of a matrix (i.e. an M×N array). Alternatively, the recesses 14 may be located along the edges of the upper surface 12 of the carrier substrate 10 in the form of a matrix.

Figure 12:
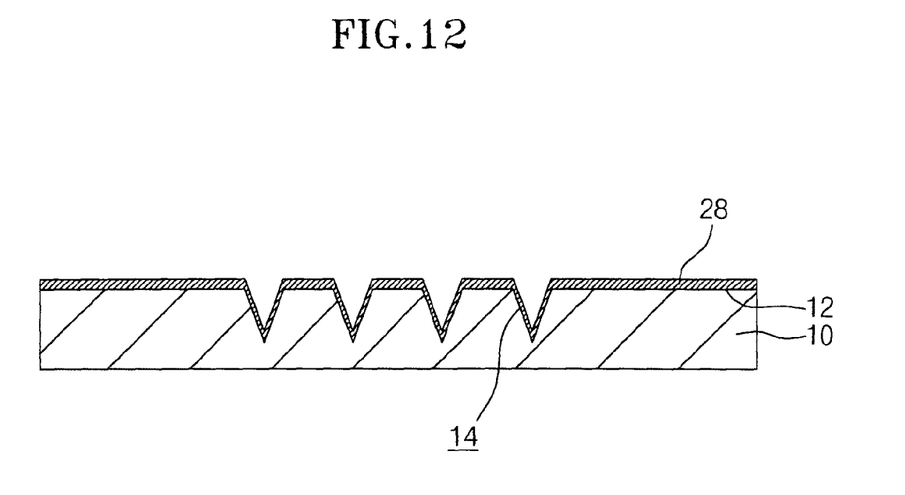

Referring to FIG. 12, a conductive layer 28 containing a metallic material is formed on the upper surface 12 of the carrier substrate 10, as well as on the surfaces that define the recesses 14, through an electroless plating process or an electroplating process after the recesses 14 are defined on the upper surface 12 of the carrier substrate 10. The conductive layer 28 is formed to have a first thickness on the upper surface 12 of the carrier substrate 10 and a second thickness, less than the first thickness, on the portions of the surface of the carrier substrate 10 that define the recesses 14.

Figure 13:
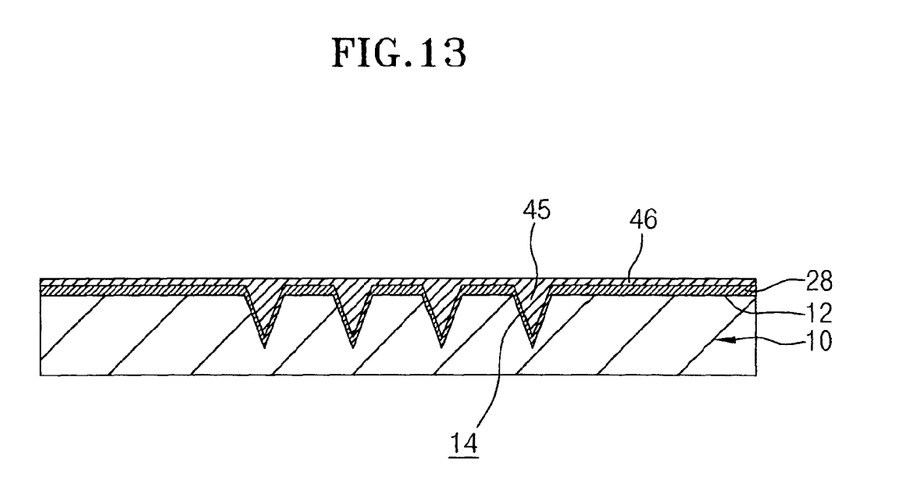

Referring to FIG. 13, a plating layer 46 is formed on the conductive layer 28 and within the recesses after the conductive layer 28 is formed on the upper surface 12 of the carrier substrate 10. The portion of the plating layer 46 filling the recesses 14 being the bumps 45. According to the present embodiment, the plating layer 46 having the bumps 45 may be formed through an electroplating process.

Figure 14:
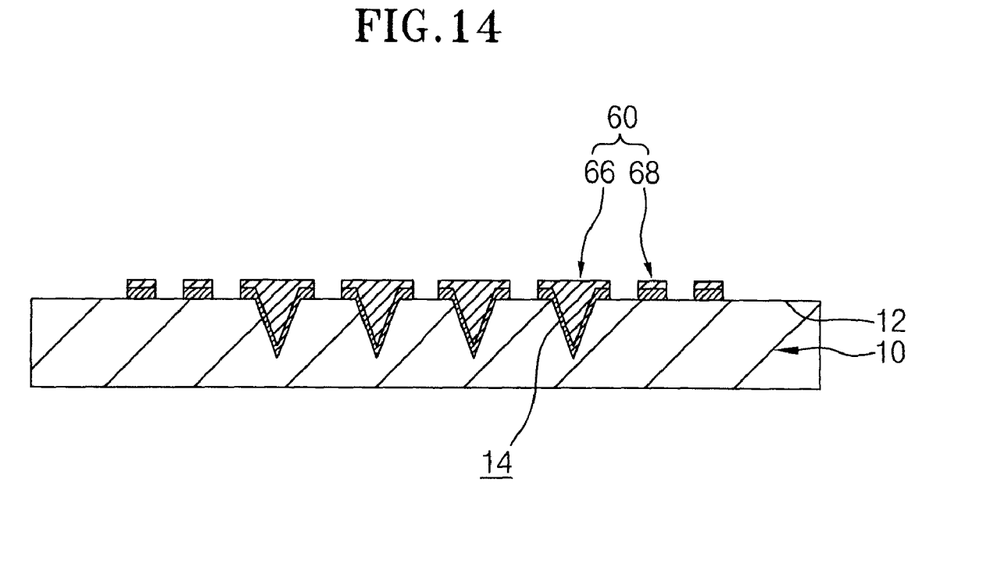

Referring to FIG. 14, after the plating layer 46 having the bumps 45 is formed on the conductive layer 28, a photoresist film (not shown) is formed on the plating layer 46. The photoresist film is patterned through a lithographic process and a development process, by which photoresist patterns (not shown) are formed on the plating layer 46.

First circuit patterns 60 having bump structures 66 and wiring lines 68, are formed on the upper surface 12 of the carrier substrate 10 by patterning the plating layer 46 and the conductive layer 28 using the photoresist patterns as etch masks.

As is apparent from the above description, in the present invention, recesses are defined on a carrier substrate, then by utilizing the recesses, bumps are formed corresponding to the shape and location of the recesses. Therefore, when compared to bumps formed by etching a metal layer through a wet etching process, the bumps formed according to the present invention require less manufacturing time and the uniform shape of the bumps may be maintained.

Although specific embodiments of the present invention have been described for illustrative purposes, those skilled in the art will appreciate that various modifications, additions, and substitutions are possible, without departing from the scope and the spirit of the invention as disclosed in the accompanying claims.

What is claimed is:

1. A method for manufacturing a semiconductor package, comprising the steps of:
   attaching a first conductive layer on an upper surface of a carrier substrate;
   defining recesses in the upper surface of the carrier substrate by patterning the first conductive layer and the carrier substrate;
   forming a metal seed layer on the first conductive layer and on portions of the upper surface of the carrier substrate which define the recesses;
   forming a plating layer on the metal seed layer such that the plating layer fills the recesses defined on the upper surface of the carrier substrate, the plating layer filling the recesses being bumps; and
   forming first circuit patterns by patterning the plating layer, the metal seed layer, and the first conductive layer, the first circuit patterns comprise bumps filling the recesses which are defined in the upper surface of the carrier substrate;
   forming an insulation layer on the upper surface of the carrier substrate including the first circuit patterns to cover the first circuit patterns;
   forming second circuit patterns on an upper surface of the insulation layer to be electrically connected with the first circuit patterns; and
   separating the carrier substrate from the insulation layer.

2. The method according to claim 1, wherein, in the step of defining the recesses, the portions of the upper surface of the carrier substrate defining the recesses have the one of a cone shape and a circular column shape.

3. The method according to claim 1, wherein, in the step of forming the metal seed layer, the metal seed layer is formed through one of an electroless plating process and an electroplating process.

4. The method according to claim 1, wherein, in the step of defining the recesses, the recesses are defined using a laser beam, through a laser drilling process, or through a drilling process.

5. The method according to claim 1, wherein, in the step of forming the plating layer having the bumps, the plating layer having the bumps is formed through a plating process.

6. The method according to claim 1, wherein the step of forming the second circuit patterns comprises the steps of:
   forming a second conductive layer on the insulation layer;
   patterning the second conductive layer and the insulation layer so as to define via holes exposing the first circuit patterns;

forming conductive vias for connecting the second conductive layer and the first circuit patterns within the via holes; and patterning the second conductive layer formed on the insulation layer.

7. The method according to claim 1, wherein, after the step of separating the carrier substrate from the insulation layer, the method further comprises the step of:

adjusting a height of the bumps.

8. The method according to claim 7, wherein, in the step of adjusting the height of the bumps, wherein by adjusting the height of the bumps the shape of the bumps is changed to one of a truncated cone shape and a circular column shape.

9. The method according to claim 1, wherein, the first conductive layer is formed to have a first thickness and the meal seed layer is formed to have a second thickness, wherein the second thickness is less than the first thickness.

10. The method according to claim 1, wherein, in the step of forming the first circuit patterns, the bumps are formed at a central portion of the carrier substrate.

11. The method according to claim 1, wherein, in the step of forming the first circuit patterns, the bumps are formed along one or more edges of the carrier substrate.

12. The method according to claim 1, wherein, after the step of forming the second circuit patterns, the method further comprises the steps of:

forming a first solder resist pattern on the insulation layer, the first solder resist pattern having first openings exposing portions of the second circuit patterns; and forming a second solder resist pattern on the insulation layer, the second solder resist pattern having second openings exposing portions of the bumps.

13. The method according to claim 12, wherein, after the step of forming the first solder resist pattern, the method further comprises the step of:

forming at least one of a nickel layer and a gold layer on the second circuit patterns within the first openings.

14. The method according to claim 12, wherein, after the steps of forming the first and second solder resist patterns, the method further comprises the step of:

electrically coupling bonding pads of a semiconductor chip to corresponding bumps, wherein the bonding pads of the semiconductor chip are formed to face the corresponding bumps.

15. The method according to claim 14, further comprising the step of:

filling an under-fill material between the semiconductor chip and the second solder resist patterns such that the under-fill material fills a gap defined between the semiconductor chip and the second solder resist pattern.

16. The method according to claim 12, wherein, after the step of forming the first and second solder resist patterns, the method further comprises the steps of:

placing an adhesive member on the second solder resist patterns;

attaching the semiconductor chip on the adhesive member such that the bonding pads of the semiconductor chip face the second solder resist patterns; and connecting the bonding pads and the first circuit patterns using conductive wires.

17. The method according to claim 16, wherein the bumps are formed to have a height greater than a thickness of the semiconductor chip.

* * * * *